United States Patent
Pei

(10) Patent No.: US 8,623,142 B2
(45) Date of Patent: Jan. 7, 2014

(54) COATING APPARATUS

(75) Inventor: Shao-Kai Pei, Taipei-Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 501 days.

(21) Appl. No.: 12/947,809

(22) Filed: Nov. 16, 2010

(65) Prior Publication Data

US 2011/0271909 A1 Nov. 10, 2011

(30) Foreign Application Priority Data

May 5, 2010 (TW) .............................. 99114373 A

(51) Int. Cl.
- C23C 16/00 (2006.01)
- C23F 1/00 (2006.01)
- H01L 21/306 (2006.01)
- C23C 16/452 (2006.01)

(52) U.S. Cl.
USPC ............... 118/719; 118/715; 118/723 ER; 118/723 IR; 118/728; 118/729; 118/730; 156/345.1; 156/345.31; 156/345.33; 156/345.35; 156/345.51; 156/345.54; 156/345.55

(58) Field of Classification Search
USPC ...... 118/715, 719, 723 ER, 723 IR, 728–730; 156/345.1, 345.31, 345.33, 345.35, 156/345.51, 345.54–345.55
See application file for complete search history.

(56) References Cited

U.S. PATENT DOCUMENTS

| | | | | | |
|---|---|---|---|---|---|
| 4,694,779 | A | * | 9/1987 | Hammond et al. | 118/730 |
| 5,169,478 | A | * | 12/1992 | Miyamoto et al. | 156/345.37 |
| 5,338,362 | A | * | 8/1994 | Imahashi | 118/719 |
| 6,117,283 | A | | 9/2000 | Chen et al. | |
| 7,895,971 | B2 | * | 3/2011 | Tian et al. | 118/723 MW |
| 8,038,836 | B2 | * | 10/2011 | Hayashi | 156/345.35 |
| 8,163,088 | B2 | * | 4/2012 | Lamouroux et al. | 118/715 |
| 2006/0254519 | A1 | | 11/2006 | Brcka | |

FOREIGN PATENT DOCUMENTS

| | | |
|---|---|---|
| CN | 1265222 A | 8/2000 |
| CN | 2525101 Y | 12/2002 |
| CN | 1500285 A | 5/2004 |
| CN | 1847447 A | 10/2006 |
| CN | 101627454 A | 1/2010 |
| JP | 2005264250 A | 9/2005 |

* cited by examiner

Primary Examiner — Rakesh Dhingra
Assistant Examiner — Benjamin Kendall
(74) Attorney, Agent, or Firm — Altis Law Group, Inc.

(57) ABSTRACT

A coating apparatus includes a base, actuators, separating boards and a gas guide grill. The base includes a carrying surface for supporting a workpiece. The base defines recesses on the carrying surface. The actuators include shafts rotatably located in the recesses correspondingly, and motors for driving the shafts. The separating boards are located above the carrying surface and securely connected to the shafts. The separating boards define chambers therebetween. The separating boards are capable of being rotated toward the carrying surface by the shafts. The gas guide grill is located above the base. The gas guide grill defines gas guide holes corresponding to the chambers respectively.

20 Claims, 8 Drawing Sheets

COATING APPARATUS

BACKGROUND

1. Technical Field

The present disclosure relates to coating technologies and, particularly, to a coating apparatus.

2. Description of Related Art

In order to provide electronic products with colorful appearances, electromagnetic interference shielding, and protection from oxidation, they may be subjected to a sputter coating process. For example, an electromagnetic interference mask may be coated on a case of an electronic product to protect inner electronic components from outer electromagnetic interferences.

Sputter coating is a process whereby atoms are ejected from a solid target material due to bombardment on the target by energetic particles, for example by plasma ion. Sputtered atoms ejected into the plasma gas are not in their thermodynamic equilibrium state, and tend to deposit on all surfaces in the chamber. A workpiece placed in the chamber will be coated with a thin film. However, the plasma bombardments on the workpiece may heat the workpiece and damage the film coating. In addition, movement of at least some of the plasma ions will be random, which may lead to an uneven coating film.

Therefore, it is desirable to provide a coating apparatus which can overcome the above-mentioned limitations.

BRIEF DESCRIPTION OF THE DRAWINGS

Many aspects of the present disclosure should be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the views.

DETAILED DESCRIPTION

Embodiments of the present disclosure will now be described in detail with reference to the drawings.

Figure 1:
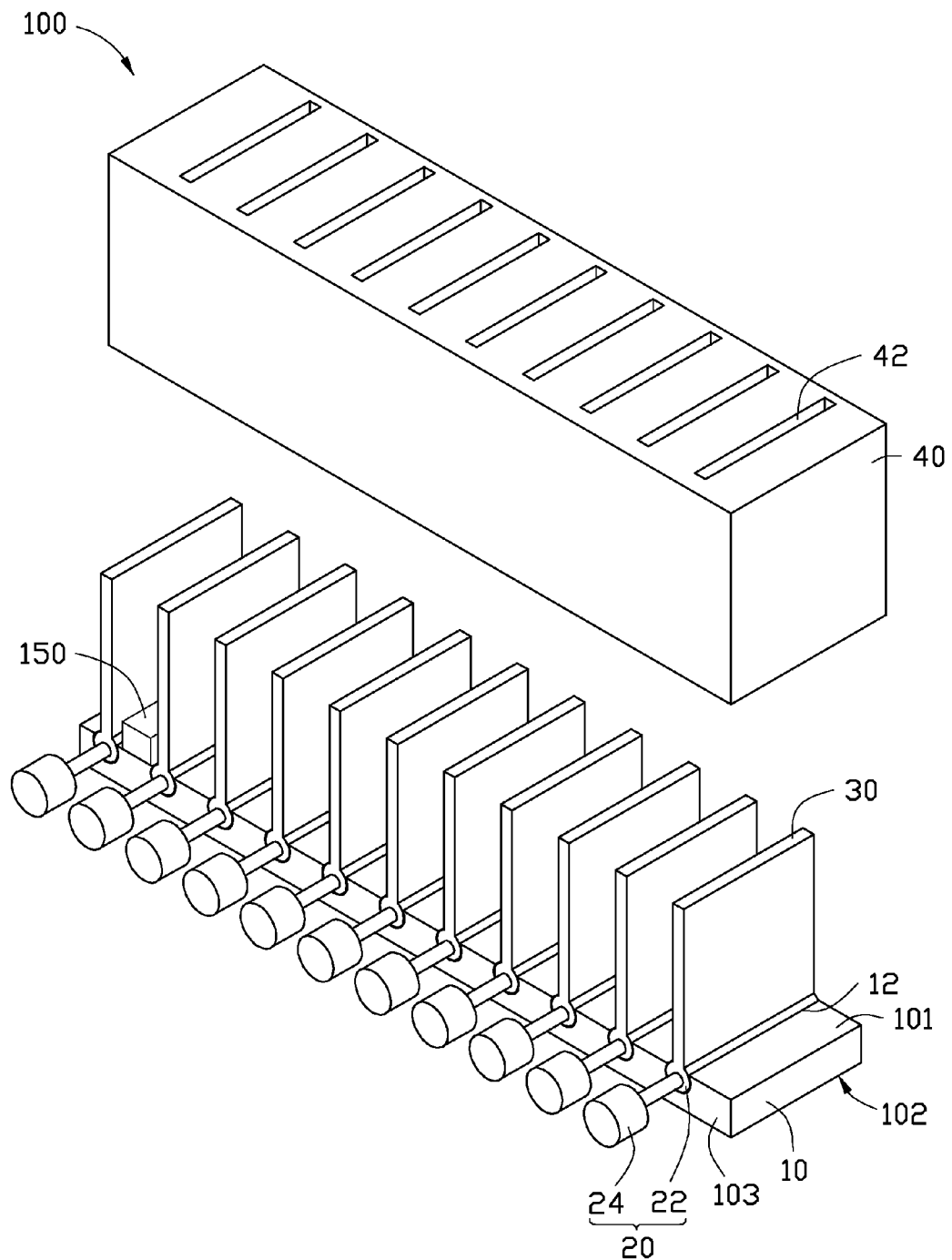
FIG. 1 is a schematic view of a coating apparatus, according to a first embodiment.
Figure 2:
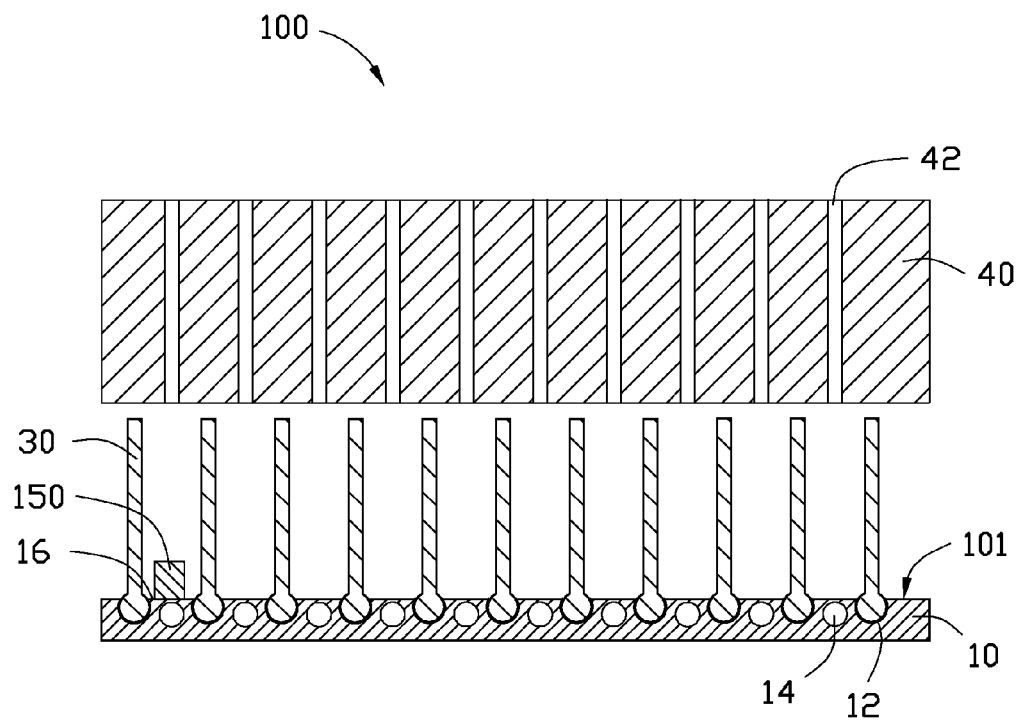
FIG. 2 is a cross-sectional view of the coating apparatus of FIG. 1 under a first state.

Referring to FIGS. 1-2, a coating apparatus 100, according to a first embodiment, includes a base 10, eleven separating boards 30, eleven actuators 20, and a gas guide grill 40. The base 10 supports a workpiece 150. The eleven separating boards 30 control movement of plasma gas. Each actuator 20 is configured for rotating a corresponding one of the separating boards 30. The gas guide grill 40 guides the plasma gas into the spaces between the separating boards 30.

The base 10 is a cuboid plate including a carrying surface 101, a bottom surface 102 opposite to the carrying surface 101, and a side surface 103 connecting the carrying surface 101 to the bottom surface 102. The carrying surface 101 carries the workpiece 150 to be coated. The side surface 103 is adjacent to a long side of the carrying surface 101. The base 10 defines eleven recesses 12 on the carrying surface 101. Each recess 12 extends along the direction of a short side of the carrying surface 101, and is perpendicular to the long side of the carrying surface 101. The recesses 12 are aligned along the long side of the carrying surface 101. The recesses 12 are equidistant from each other. A cross-section of each recess 12 taken parallel to the side surface 103 has an arc shape, with an angle subtended by the arc being greater than 180 degrees but less than 360 degrees for receiving and retaining a portion of the actuator 20. The workpiece 150 to be coated may be placed between two adjacent separating boards 30. The number and position of the workpiece 150 are not limited by this embodiment.

As shown in FIG. 2, the base 10 may further define ten cooling pipes 14 therein. Cooling liquid or gas can flow in the cooling pipes 14 to cool the workpiece 150. Accordingly, overheating of the workpiece 150 is avoided, and quality of the film coating is increased. The cooling pipes 14 can be located under the carrying surface 101 between the adjacent separating boards 30.

As shown in FIG. 1, each actuator 20 includes a motor 24 and a shaft 22. The shafts 22 are rotatably located in the recesses 12 correspondingly. The motors 24 are located outside the base 10 and beside the side surface 103. The actuators 20 are mainly for driving the separating boards 30 to rotate by various degrees and are not limited to this embodiment, and other configurations that can perform the rotations can be employed too.

The separating boards 30 define ten chambers 16 therebetween on the carrying surface 101. The separating boards 30 are parallel to the corresponding shafts 22. Each separating board 30 is securely connected to the corresponding shaft 22. The shafts 22 are coupled to the motors 22 to obtain the driving force. Thus, the separating boards 30 can be driven to tilt toward the carrying surface 101 of the base 10 by the motors 24. The separating boards 30 can change the flowing direction of the plasma gas as required, so a direct plasma bombardment on the workpiece 150 can be avoided. Accordingly, the workpiece 150 will not be overheated by the bombardment, and bombardment damage to the film coating is prevented. The uniformity of the coating can be further improved by adjusting the flow amount and flow rate of the plasma gas by adjusting orientations of the separating boards 30.

Figure 3:
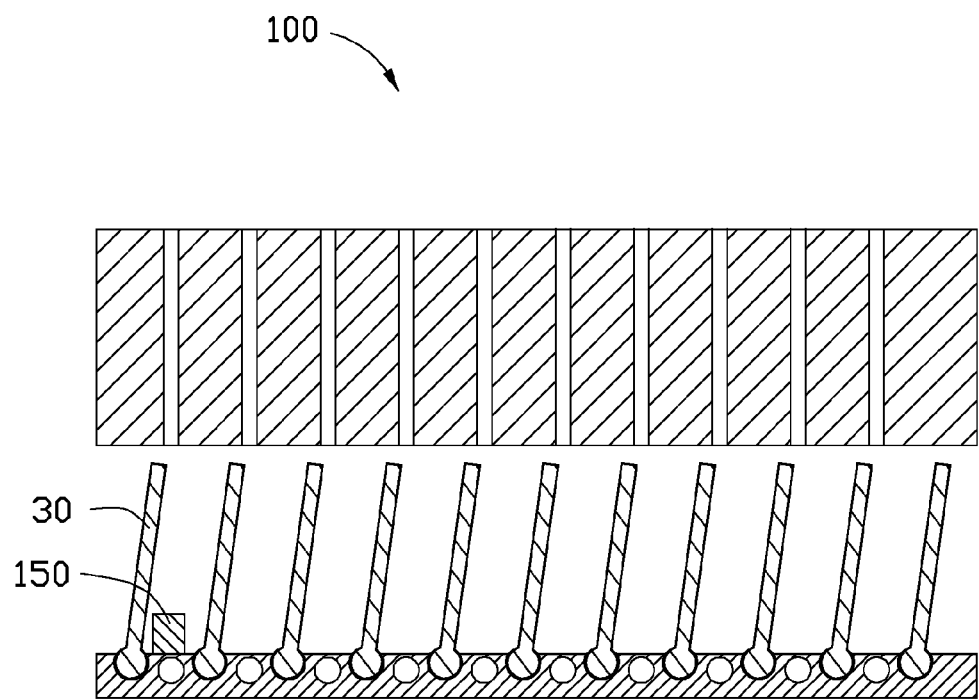
FIG. 3 is a cross-sectional view of the coating apparatus of FIG. 1 under a second state.
Figure 4:
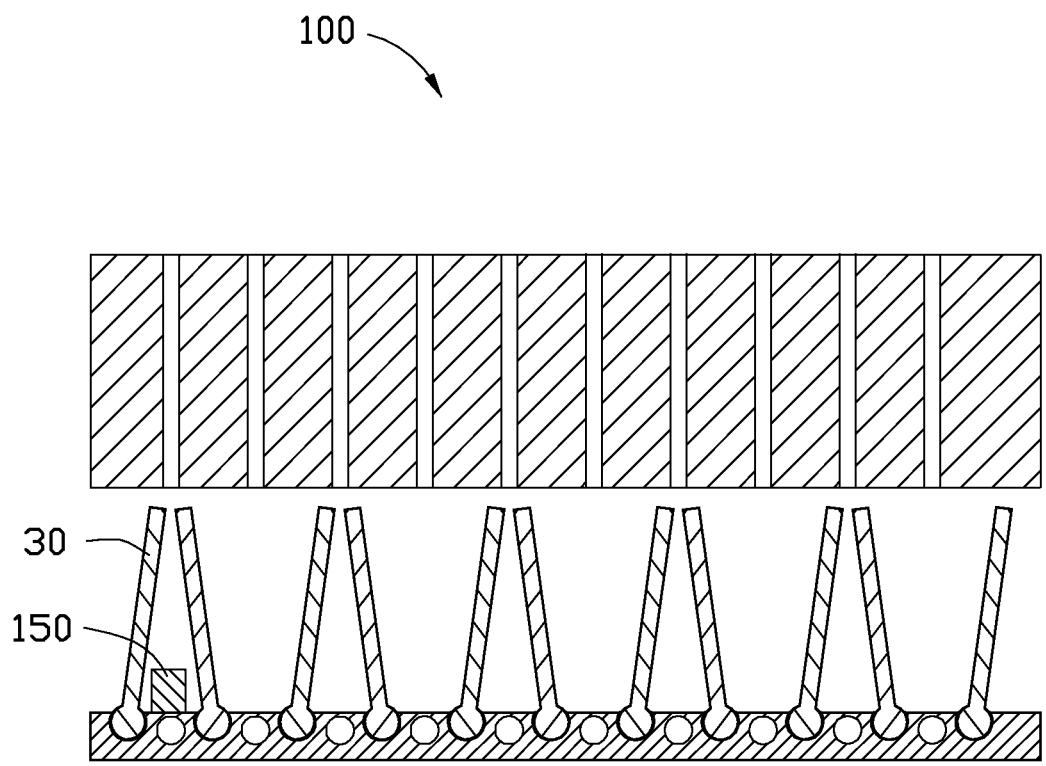
FIG. 4 is a cross-sectional view of the coating apparatus of FIG. 1 under a third state.

When the coating apparatus 100 is in the first state as shown in FIG. 2, each separating board 30 is perpendicular to the carrying surface 101, thus each chamber 16 is a cube-shaped space. When the coating apparatus 100 is in the second state as shown in FIG. 3, all the separating boards 30 are rotated to tilt in the same direction, so that each chamber 16 is a parallelepiped-shaped space. Accordingly, direct plasma bombardment on the workpiece 150 is effectively reduced. When the coating apparatus 100 is in the third state as shown in FIG. 4, each two adjacent separating boards 30 tilt toward different directions, and each chamber 16 is a trapezoidal-shaped space. The workpiece 150 may be placed between two adjacent separating boards 30 tilting toward the workpiece 150, and thereby the separating boards 30 reduce the flow gas reaching the workpiece 150. The workpiece 150 may be placed between two adjacent separating boards 30 tilting away from the workpiece 150, and thereby the separating boards 30 increase the flow gas reaching the workpiece 150.

The gas guide grill 40 is located above the base 10. The gas guide grill 40 defines ten gas guide holes 42 corresponding to the ten chambers 16 respectively. The gas guide grill 40 guides the plasma gas through the gas guide holes 42 into the chambers 16, so the workpiece 150 placed therein can be coated.

Figure 5:
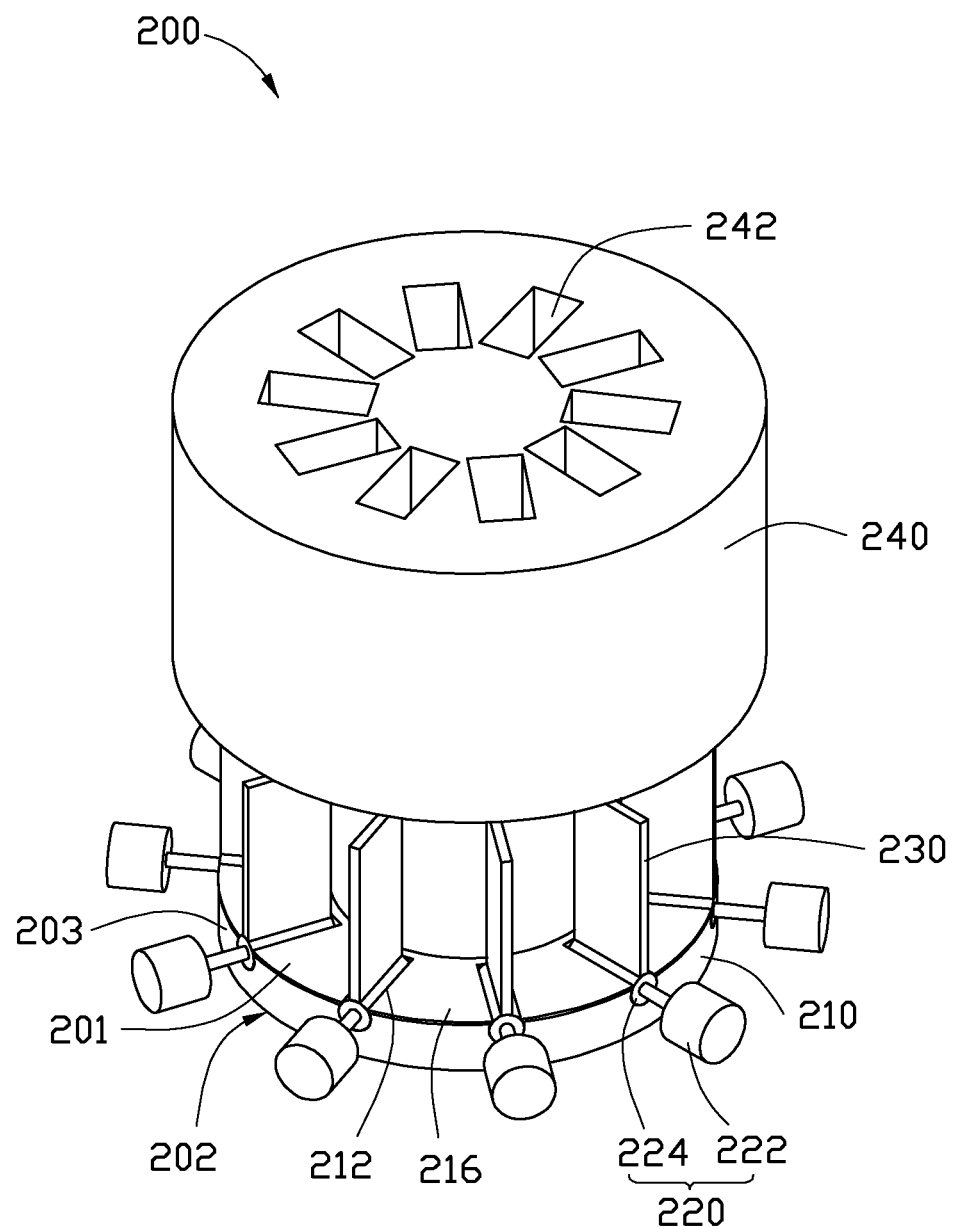
FIG. 5 is a schematic view of a coating apparatus, according to a second embodiment.
Figure 6:
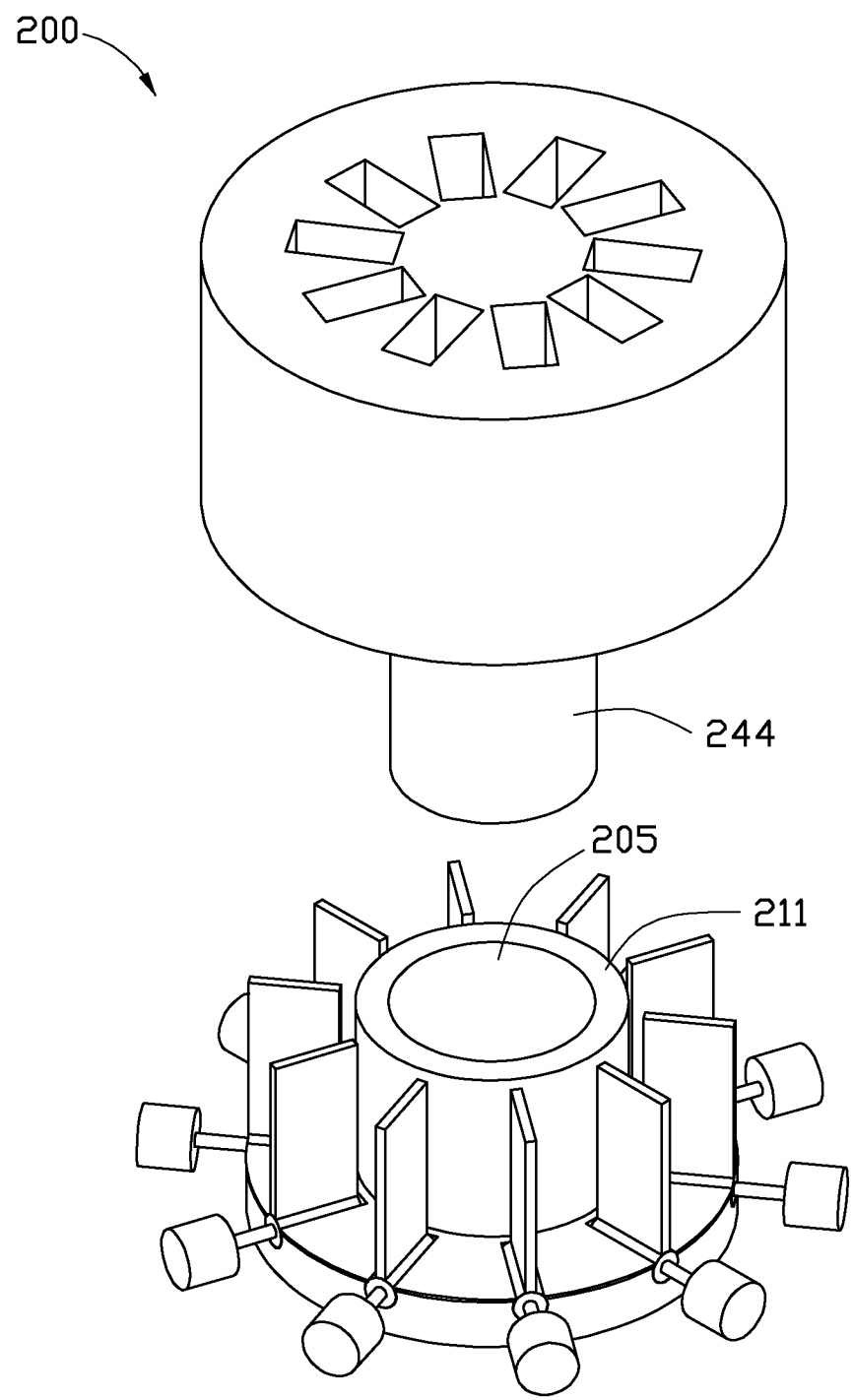
FIG. 6 is an exploded, isometric view of the coating apparatus of FIG. 5.
Figure 7:
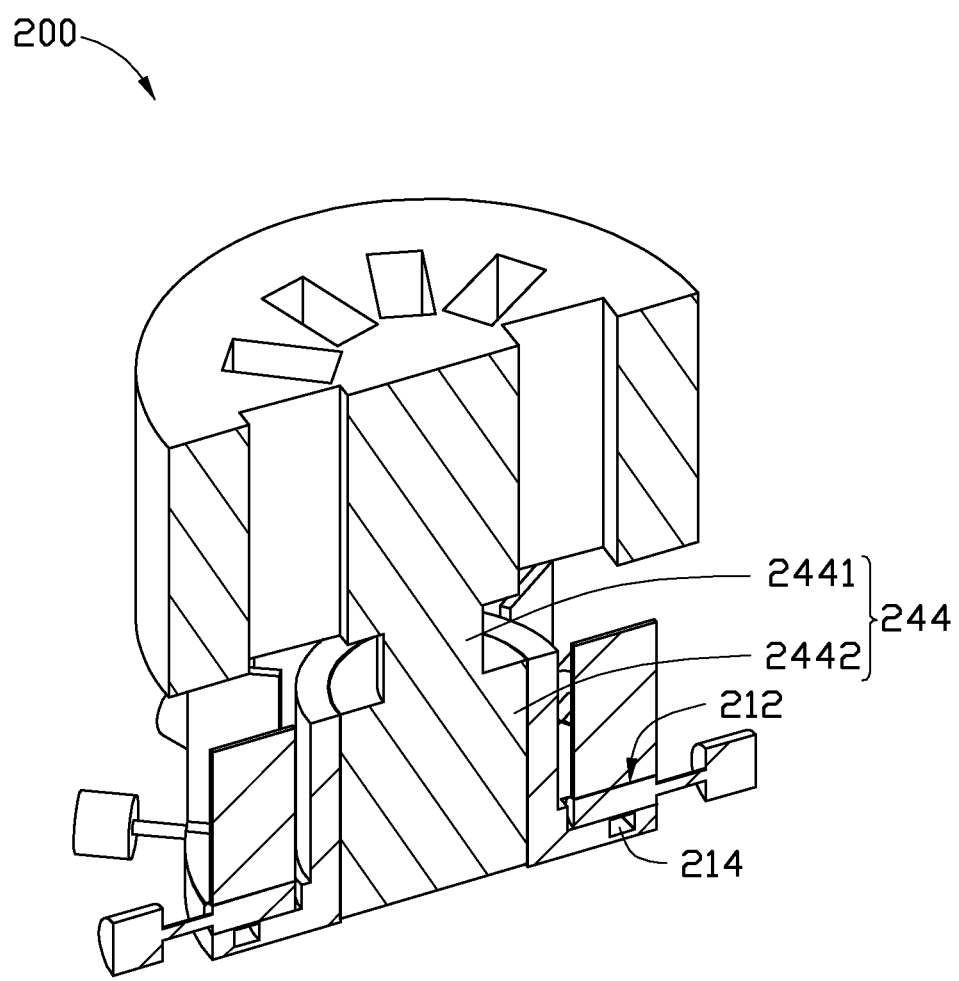
FIG. 7 is a cross-sectional view of the coating apparatus of FIG. 5.

The base 10, the chambers 16, and the separating board 30 can have other configurations in other embodiments. Referring to FIGS. 5-7, the coating apparatus 200 is similar to the coating apparatus 100, except that the base 210 and the gas guide grill 240 have substantially cylindrical configurations. The base 210 is substantially a cylindrical plate including a circular carrying surface 201 and a cylindrical setting 211 located at the center of the circular carrying surface 201.

The cylindrical setting 211 is substantially a protruding cylinder including a through hole 205 at the center. The through hole 205 extends through the base 210, and thus communicates the circular carrying surface 201 with the bottom surface 202.

The recesses 212 surround the cylindrical setting 211, and are arranged in the radial directions of the base 210. The recesses 212 are equidistant from each other in the circumferential directions.

A cross-section of each recess 212 taken parallel to the side surface 203 has an arc shape, with an angle subtended by the arc being greater than 180 degrees but less than 360 degrees for receiving and retaining a portion of the shaft 224. The recesses 212 may extend into the cylindrical setting 211 in other embodiments. When the recesses 212 extend into the cylindrical setting 211, the cross-section of each recess 212 in the cylindrical setting 211 is circular, and the shafts 224 can be held in place by the circular areas in the cylindrical setting 211. In such a case, portions of the recesses 212 outside the cylindrical setting 211 may form arcs subtending angles less than 180 degrees.

The actuators 220 including motors 222 and shafts 224 are accordingly arranged in a radial configuration on the base 210. The shafts 224 are rotatably located in the recesses 212. The motors 222 are located outside the base 210 and beside the side surface 203.

Ten separating boards 230 define ten chambers 216 therebetween above the carrying surface 201, and accordingly each chamber 216 includes an arc-shaped space. Each separating board 230 is securely connected to the corresponding shaft 224, and thus the separating boards 230 are arranged in the radial configuration. The separating boards 230 can be driven to tilt toward the carrying surface 201 of the base 210 by the motors 222.

The gas guide grill 240 is substantially a cylinder located above the base 210, and includes ten gas guide holes 242 corresponding to the ten chambers 216. The gas guide holes 242 are equidistant from each other in the circumferential directions of the gas guide grill 240. In this embodiment, the gas guide grill 240 further includes a location pole 244 fitting for the through hole 205 of the cylindrical setting 211. The location pole 244 is longer than the through hole 205, so the gas guide grill 240 can be engaged with the base 210 through the location pole 244 and the through hole 205.

As shown in FIG. 7, the location pole 244 includes a transition portion 2441 and a matching portion 2442 in this embodiment. The transition portion 2441 connects the matching portion 2442 to the main cylindrical plate defining the gas guide holes 242. The diameter of the transition portion 2441 may be less than the diameter of the matching portion 2442. The matching portion 2442 matches in size and shape the through hole 205.

The base 210 may further define ten cooling pipes 214. The cooling pipes 214 are arranged in the circumferential directions of the base 210, surrounds the setting 211, and are located corresponding to the ten chambers 216.

Figure 8:
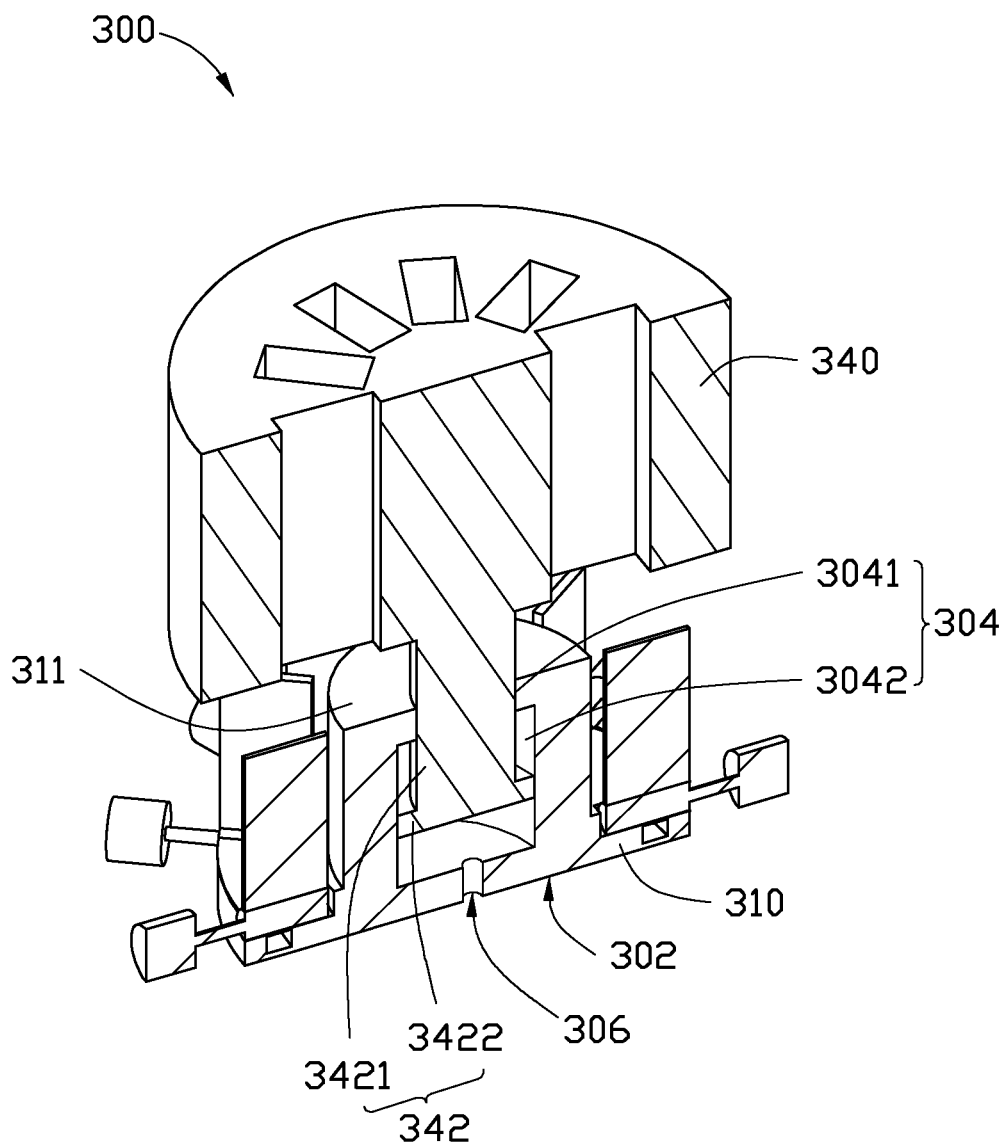
FIG. 8 is a schematic view of a coating apparatus, according to a third embodiment.

Referring to FIG. 8, the coating apparatus 300 is similar to the coating apparatus 200, except that the cylindrical setting 311 of the coating apparatus 300 defines a cavity 304, and a valve 306 under the cavity 304.

The cavity 304 is distant from the bottom surface 302 of the base 310. The cavity 304 includes a cylinder portion 3042 and a contraction portion 3041. The cylinder portion 3042 is wider than the contraction portion 3041. The contraction portion 3041 is located on the top of the cylindrical setting 311. The valve 306 is located in the bottom surface 302 of the base 310 to control flow of liquid or gas between the cylinder portion 3042 and an external device.

The gas guide grill 340 includes a piston 342 extending into the cavity 304. The piston 342 includes a piston rod 3421 and a piston cap 3422 fitting tightly on the head of the piston rod 3421. The diameter of the piston rod 3421 is substantially equal to the diameter of the contraction portion 3041, and the outer diameter of the piston cap 3422 is substantially equal to the diameter of the cylinder portion 3042, so the piston cap 3422 can press against the inner surface of the cylinder portion 3042 to form a seal between the piston cap 3422 and the cylinder portion 3042. The piston cap 3422 can prevent the piston 342 escaping from the cylindrical setting 311, and prevents leakage of inner fluid through the contraction portion 3041. The piston 342 may further include a rubber ring covering the outer surface of the piston cap 3422 and a lubricant on the inner surface of the cylinder portion 3042, so the wear-resistance and tightness between the piston cap 3422 and the cylinder portion 3042 are improved.

In operation, fluid can be forced to flow in or out the cylinder portion 3042 through the valve 306, by, for example, pressure developed by the external device. The introduction of fluid increases the fluid pressure under the piston 342, and pushes the piston 342 and the gas guide grill 340 up and away from the carrying surface 301. The extraction of fluid decreases the fluid pressure under the piston 342, and pulls the piston 342 and the gas guide grill 340 down toward the carrying surface 301. Accordingly, a distance between the carrying surface 301 of the base 310 and the gas guide grill 340 can be adjusted. A distance for the plasma gas from the gas guide grill 340 to the workpiece 150 and a concentration of the plasma gas reaching the workpiece 150 can also be adjusted. Thus, the thickness and the uniformity of the film coating can be controlled as required.

The configurations of the bases and the gas guide grills of the coating apparatuses are not limited by the above embodiments but can be redesigned depending on requirements. For example, the bases and the gas guide grills may be substantially cuboid, triangular prism-shaped, elliptical columnar, or cylindrical.

Compared to the prior art, the coating apparatus of the present disclosure includes separating boards that define chambers therebetween above the carrying surface, and a gas guide grill corresponding to the chambers, actuators that drive the rotation of the separating boards. Accordingly, the coating apparatus can control the flowing paths of the plasma gas by the separating boards and the gas guide grill. A direct plasma ion bombardment on the workpiece can be prevented, and overheat of the workpiece is avoided. As a result, stability of the coating process, the coating uniformity and coating quality are improved.

It will be understood that the above particular embodiments are shown and described by way of illustration only. The principles and the features of the present disclosure may be employed in various and numerous embodiment thereof without departing from the scope of the disclosure as claimed. The above-described embodiments illustrate the scope of the disclosure but do not restrict the scope of the disclosure.

What is claimed is:

1. A plasma coating apparatus, comprising: a base, the base comprising a carrying surface adapted to support a workpiece, the carrying surface defining a plurality of recesses; a plurality of actuators, each of the plurality of actuators comprising: a shaft rotatably located in a corresponding one of the plurality of recesses; and a motor connected to the shaft; a plurality of separating boards connected to the plurality of shafts respectively, the plurality of separating boards defining a plurality of chambers therebetween, the plurality of separating boards rotatable toward the carrying surface by the plurality of shafts; and a gas guide grill located above the base, the gas guide grill defining a plurality of gas guide holes corresponding to the plurality of chambers.

2. The plasma coating apparatus of claim 1, wherein the base further comprises: a bottom surface opposite to the carrying surface; and a side surface connecting the carrying surface and the bottom surface, a cross-section of each of the plurality of recesses taken parallel to the side surface having an arc shape.

3. The plasma coating apparatus of claim 2, wherein an angle subtended by the arc shape is greater than 180 degrees and less than 360 degrees.

4. The plasma coating apparatus of claim 2, wherein the plurality of motors are located outside the base and beside the side surface.

5. The plasma coating apparatus of claim 1, wherein the base further defines a plurality of cooling pipes therein.

6. The plasma coating apparatus of claim 5, wherein the plurality of cooling pipes are located under the carrying surface and correspond to the chambers.

7. The plasma coating apparatus of claim 1, wherein the base is a cuboid plate.

8. The plasma coating apparatus of claim 7, wherein each of the plurality of recesses is perpendicular to a long side of the cuboid plate.

9. The plasma coating apparatus of claim 8, wherein the plurality of recesses are equidistant from each other.

10. The plasma coating apparatus of claim 1, wherein the base is a cylindrical plate, and the carrying surface is circular-shaped.

11. The plasma coating apparatus of claim 10, wherein the base comprises a cylindrical setting at a center of the carrying surface.

12. The plasma coating apparatus of claim 11, wherein the cylindrical setting defines a through hole at a center thereof.

13. The plasma coating apparatus of claim 12, wherein the gas guide grill comprises a location pole received in the through hole.

14. The plasma coating apparatus of claim 13, wherein the plurality of recesses are arranged in radial directions of the base and surround the cylindrical setting.

15. The plasma coating apparatus of claim 14, wherein the plurality of recesses are equidistant from each other in a circumferential direction of the base.

16. The plasma coating apparatus of claim 10, wherein the cylindrical setting defines a cavity at a center thereof, the cavity comprises a cylinder portion and a contraction portion, and a diameter of the cylinder portion is greater than a diameter of the contraction portion.

17. The plasma coating apparatus of claim 16, wherein the gas guide grill comprises a piston extending into the cavity.

18. The plasma coating apparatus of claim 17, wherein the piston comprises a piston rod and a piston cap positioned on a head of the piston rod, the piston rod extends through the contraction portion, the piston cap is received in the cylinder portion and presses against an inner surface of the cylinder portion.

19. The plasma coating apparatus of claim 18, wherein a diameter of the piston rod substantially equals a diameter of the contraction portion, and an outer diameter of the piston cap substantially equals a diameter of the cylinder portion.

20. A plasma coating apparatus, comprising: a base, the base comprising a carrying surface adapted to support a workpiece, the carrying surface defining a plurality of recesses; a plurality of actuators, the plurality of actuators comprising: a plurality of shafts rotatably located in the plurality of recesses correspondingly; and at least one motor to drive the plurality of shafts; a plurality of separating boards located above the carrying surface and connected to the plurality of shafts correspondingly, the plurality of separating boards defining a plurality of chambers therebetween, the plurality of separating boards rotatable toward the carrying surface by the plurality of shafts; and a gas guide grill located above the base, the gas guide grill defining a plurality of gas guide holes corresponding to the plurality of chambers respectively.

* * * * *